(12) United States Patent
Wu et al.

(10) Patent No.: US 12,040,437 B2
(45) Date of Patent: Jul. 16, 2024

(54) MICRO LIGHT-EMITTING COMPONENT, MICRO LIGHT-EMITTING STRUCTURE AND DISPLAY DEVICE

(71) Applicant: PlayNitride Display Co., Ltd., Zhunan Township, Miaoli County (TW)

(72) Inventors: Bo-Wei Wu, Zhunan Township, Miaoli County (TW); Yu-Yun Lo, Zhunan Township, Miaoli County (TW); Shiang-Ning Yang, Zhunan Township, Miaoli County (TW)

(73) Assignee: PLAYNITRIDE DISPLAY CO., LTD., Zhunan Township, Miaoli County (TW)

( * ) Notice: Subject to any disclaimer, the term of this patent is extended or adjusted under 35 U.S.C. 154(b) by 429 days.

(21) Appl. No.: 17/473,348

(22) Filed: Sep. 13, 2021

(65) Prior Publication Data
US 2022/0367769 A1    Nov. 17, 2022

(30) Foreign Application Priority Data

May 17, 2021    (TW) .................................. 110117804

(51) Int. Cl.
*H01L 33/62*    (2010.01)
*H01L 25/075*    (2006.01)
(Continued)

(52) U.S. Cl.
CPC .......... *H01L 33/62* (2013.01); *H01L 25/0753* (2013.01); *H01L 33/12* (2013.01); *H01L 33/54* (2013.01)

(58) Field of Classification Search
None
See application file for complete search history.

(56) References Cited

U.S. PATENT DOCUMENTS

| 2003/0170965 A1* | 9/2003 | Kondo ..................... H01L 24/24 |
| | | 438/455 |
| 2009/0166608 A1* | 7/2009 | Nakanishi ............... H01L 33/22 |
| | | 257/E33.068 |

(Continued)

FOREIGN PATENT DOCUMENTS

| CN | 109671661 A | 4/2019 |
| CN | 111063270 A | 4/2020 |

OTHER PUBLICATIONS

Search Report for CN patent application No. 202110535887.4.

*Primary Examiner* — Evren Seven
(74) *Attorney, Agent, or Firm* — Muncy, Geissler, Olds & Lowe, P.C.

(57) ABSTRACT

A micro light-emitting component, a micro light-emitting structure and a display device are disclosed. The micro light-emitting component has a micro light-emitting chip and a buffer element. The micro light-emitting chip has a first surface, a second surface opposite to the first surface and a plurality of outer sidewalls. The buffer element is disposed on the outer sidewalls or the first surface of the micro light-emitting chip. The buffer element has an inner surface and an outer surface. An angle is defined between the inner surface and the first surface or an extended surface of the first surface. The angle is greater than or equal to 90 degrees and less than or equal to 180 degrees. Therefore, the buffer element prevents the first surface of the micro light-emitting chip from damaging by collision when the micro light-emitting chip is dropped with the first surface facing down during a transferring procedure.

17 Claims, 14 Drawing Sheets

(51) Int. Cl.
*H01L 33/12* (2010.01)
*H01L 33/54* (2010.01)

(56) References Cited

U.S. PATENT DOCUMENTS

| | | | |
|---|---|---|---|
| 2011/0207253 A1* | 8/2011 | Yang | H01L 24/81 257/E33.056 |
| 2013/0313591 A1* | 11/2013 | Shimada | H01L 33/486 257/98 |
| 2016/0172253 A1* | 6/2016 | Wu | G01R 31/2635 335/291 |
| 2017/0323873 A1* | 11/2017 | Lin | H01L 24/05 |
| 2019/0363000 A1 | 11/2019 | Wu et al. | |
| 2020/0176637 A1* | 6/2020 | Wu | H01L 33/62 |
| 2020/0350473 A1 | 11/2020 | Hsu et al. | |
| 2022/0131036 A1* | 4/2022 | Lo | H01L 33/20 |

* cited by examiner

MICRO LIGHT-EMITTING COMPONENT, MICRO LIGHT-EMITTING STRUCTURE AND DISPLAY DEVICE

CROSS-REFERENCE TO RELATED APPLICATIONS

This application is based upon and claims priority under 35 U.S.C. 119 from Taiwan Patent Application No. 110117804 filed on May 17, 2021, which is hereby specifically incorporated herein by this reference thereto.

BACKGROUND OF THE INVENTION

1. Field of the Invention

The present invention is related to a micro light-emitting component, micro light-emitting structure and display device.

2. Description of the Prior Arts

In the next generation of the flat display device, the micro LED display device is outstanding due to the features of low power consumption, high contrast, wide color gamut, long lifetime and so on.

A display panel of the micro LED display device has a great amount of micro light-emitting chips. Therefore, the micro light-emitting chips have to be effectively and accurately arranged on the display panel. The micro light-emitting chips are not damaged during the fabrication of the micro LED display device.

To overcome the micro light-emitting chip may be damaged by being collided after dropping, the present invention provides a micro light-emitting component, micro light-emitting structure and display device to mitigate or to obviate the aforementioned problems.

SUMMARY OF THE INVENTION

The objective of the present invention provides a micro light-emitting component, micro light-emitting structure and display device.

To achieve the foregoing objective, the micro light-emitting component has:
a micro light-emitting chip having a first surface, a second surface opposite to the first surface and a plurality of outer sidewalls connected between the first surface and the second surface; and
a buffer element disposed on the outer sidewalls or the first surface and having an inner surface and an outer surface;
wherein an angle is defined between the inner surface and the first surface or an extended surface of the first surface, and the angle is greater than or equal to 90 degrees and less than or equal to 180 degrees.

To achieve the foregoing objective, the micro light-emitting structure has:
a substrate; and
a micro light-emitting component disposed on the substrate and having:
a micro light-emitting chip having a first surface, a second surface opposite to the first surface and a plurality of outer sidewalls connected between the first surface and the second surface; and
a buffer element disposed on the outer sidewalls or the first surface and having an inner surface and an outer surface;
wherein an angle is defined between the inner surface and the first surface or an extended surface of the first surface, and the angle is greater than or equal to 90 degrees and less than 180 degrees.

To achieve the foregoing objective, the display device has:
a circuit substrate having two pads; and
a micro light-emitting component electrically connected to the circuit substrate and having:
a micro light-emitting chip having a first surface away from the circuit substrate, a second surface opposite to the first surface and having a plurality of electrodes electrically connected to the corresponding pads on the circuit substrate and a plurality of outer sidewalls connected between the first surface and the second surface; and
a buffer element disposed on the outer sidewalls or the first surface and having an inner surface and an outer surface;
wherein an angle is defined between the inner surface and the first surface or an extended surface of the first surface, wherein the angle is greater than or equal to 90 degrees and less than the 180 degrees.

Based on the foregoing description, each of the micro light-emitting components on the circuit substrate mainly has the buffer element disposed on the outer sidewalls or the first surface of the micro light-emitting chip. The angle is defined between the inner surface and the first surface or the extended surface of the first surface and the angle is greater than or equal to 90 degrees and less than or equal to 180 degrees. Therefore, the buffer element prevents the first surface of the micro light-emitting chip from damaging by collision when the micro light-emitting chip is dropped with the first surface facing down during transferring procedure. In addition, when the micro light-emitting chip is disposed on the circuit substrate, the buffer element may be used as a dam of quantum dot (wavelength conversion layer) since the first surface is away from the circuit substrate.

Other objectives, advantages and novel features of the invention will become more apparent from the following detailed description when taken in conjunction with the accompanying drawings.

DETAILED DESCRIPTION OF THE EMBODIMENTS

Figure 1A:
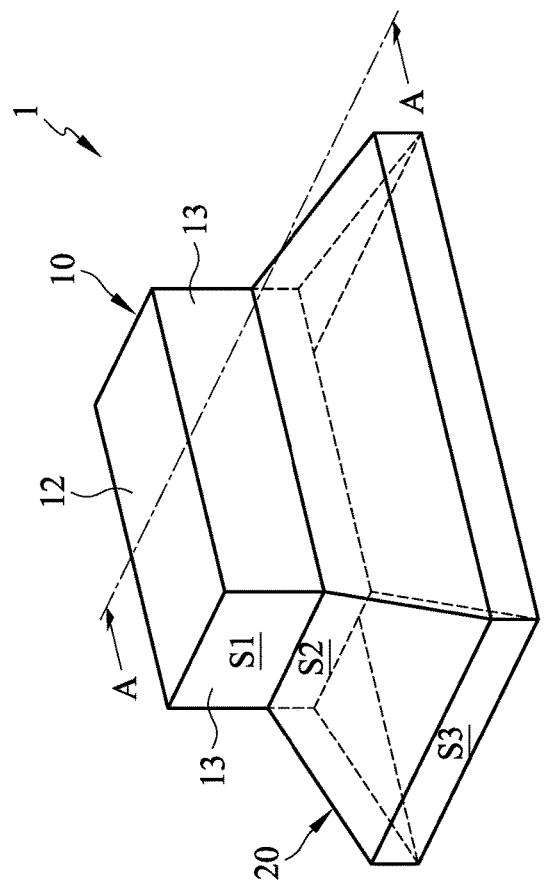
FIG. 1A is a perspective view of a first embodiment of a micro light-emitting component in accordance with the present invention.

The present invention provides a novel micro light-emitting component, micro light-emitting structure, and display device. With embodiments and drawings thereof, the features of the present invention are described in detail as follows.

With reference to FIGS. 1A to 1D, a first embodiment of a micro light-emitting component in accordance with the present invention is shown. The micro light-emitting component has a micro light-emitting chip 10 and a buffer element 20.

The micro light-emitting chip 10 has a first surface 11, a second surface 12 opposite to the first surface 11, and a plurality of outer sidewalls 13. The outer sidewalls 13 are connected between the first surface 11 and the second surface 12. In the present embodiment, the micro light-emitting chip 10 is a cuboid and has four outer sidewalls 13 but is not limited thereto.

The micro light-emitting chip 10 has a height H1 and a first orthographic projection area S5 on a plane parallel to the first surface 11. The height H1 is a first distance defined between the first surface 11 and the second surface 12 and is also a maximum vertical distance of the micro light-emitting chip 10. Each outer sidewall has an area S1 thereof. The micro light-emitting chip 10 may be a micro light-emitting diode, a maximum width W1 thereof is less than or equal to 50 μm, and a height thereof is less than or equal to 6 μm. However, the sizes are not limited thereto. In addition, the micro light-emitting chip 10 of the present embodiment may be a flip-chip structure and has, as shown in FIG. 1D, an epitaxial layer 14, an insulation layer 15, and two electrodes 16, 17. The insulation layer 15 covers a top surface 141 and a plurality of outsides 142 of the epitaxial layer 14. The two electrodes are formed on the top surface 141 and expose from the insulation layer 15. The epitaxial layer 14 has a first epitaxial semiconductor layer 14a, a light-emitting layer 14b, and a second epitaxial semiconductor layer 14c. One of the two electrodes 16 with a first electrical property is electrically connected to the first epitaxial semiconductor layer 14a. The other one of the two electrodes 17 with a second electrical property is electrically connected to the second epitaxial semiconductor layer 14d.

The buffer element 20 is disposed on the outer sidewalls 13 of the micro light-emitting chip 10 and protrudes from the first surface 11 of the micro light-emitting chip 10. The buffer element 20 has an inner surface 21 and an outer surface 22. As shown in FIG. 1D, an angle θ1 is defined between the inner surface 21 and the first surface 11. The angle θ1 is greater than or equal to 90 degrees and less than or equal to 180 degrees (90°≤θ1≤180°). In the present embodiment, the buffer element 20 has a plurality of sub-buffers 201. One end of each sub-buffer 201 is disposed on the corresponding outer sidewall 13, and the other end thereof protrudes from the first surface 11. The adjacent sub-buffers are connected integrally. In particular, the buffer element 20 is formed on a portion of the insulation layer 15 covering the outsides 141 of the epitaxial layer 14. The Young's modulus of the buffer element 20 may be less or equal to that of the insulation layer 15. If Young's modulus of the buffer element 20 is less than that of the insulation layer 15, the buffer element 20 may be removed by crushing in a later procedure, and the insulation layer 15 is avoided from being damaged. Alternatively, if the buffer element 20 is chosen with an etching rate greater than that of the insulation layer 15, the buffer element 20 may be removed by etching in the later procedure, and the insulation layer 15 is avoided from being damaged.

In the present embodiment, as shown in FIG. 1D, the micro light-emitting chip 10 has a horizontal distance W2 defined between the one of the outer sidewalls 13 and an outermost end of the buffer element 20 away from the outer sidewall 13. A ratio of the horizontal distance W2 to the width W1 is between 0.2 and 0.8 (W2/W1=0.2~0.8). If the ratio is less than 0.2, a buffering efficiency of the buffer element 20 is not good enough. On the contrary, if the ratio is greater than 0.8, the buffer element 20 occupies greater space, and a utility of the micro light-emitting chip 10 is decreased accordingly. A ratio of the width W1 of the micro light-emitting chip 10 to the maximum width W3 of the micro light-emitting component 1 is between 0.5 and 0.9 (W1/W3=0.5~0.9) but is not limited thereto.

In the present embodiment, as shown in FIG. 1D, a first vertical distance H1 defined between the second surface 12 to the first surface 11 of the micro light-emitting chip 10 is less than a second vertical distance H2 from the second surface 12 of the micro light-emitting chip 10 to the outermost end of the buffer element 20 away from the outer sidewall 13. The first vertical distance is a height of the micro light-emitting chip 10. In particular, a ratio of the second vertical distance H2 to the first vertical distance H1 is between 1.2 and 2 (H2/H1=1.2~2). If the second vertical distance H2 is between 5 μm and 15 μm, the buffer element 20 provides the buffering function and the structural stability between the buffer element 20 and the micro light-emitting chip 10 but is not limited thereto. In addition, when the micro light-emitting chip 10 is soldered to the circuit substrate 31 as shown in FIG. 13B, the buffer element 20 prevents the solder from overflowing to other micro light-emitting chips 10.

Figure 1C:
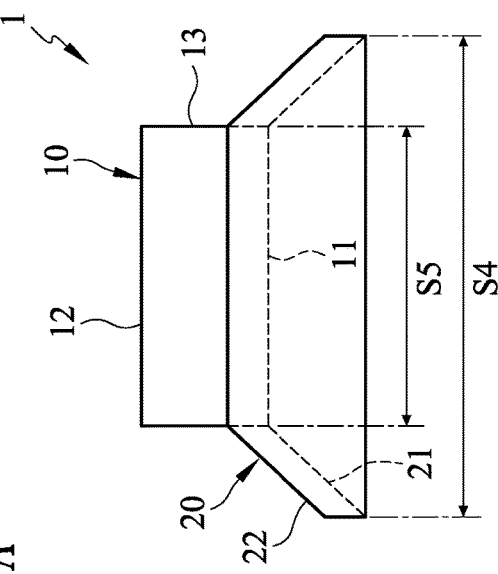
FIG. 1C is a side view of FIG. 1A.
Figure 1B:
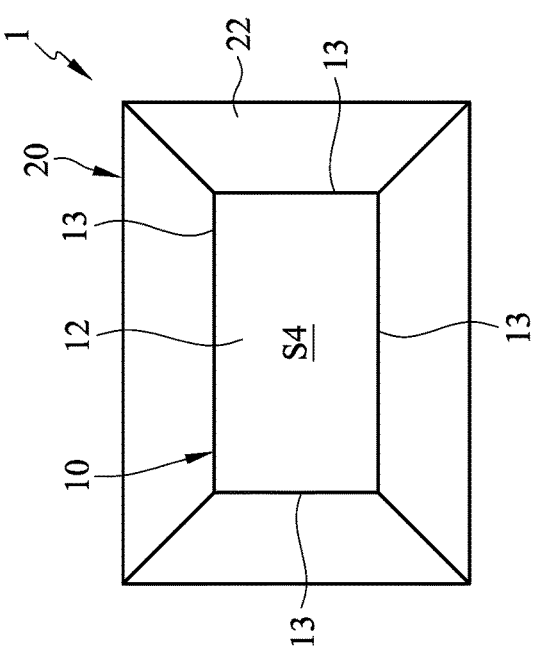
FIG. 1B is a top view of FIG. 1A.
Figure 1D:
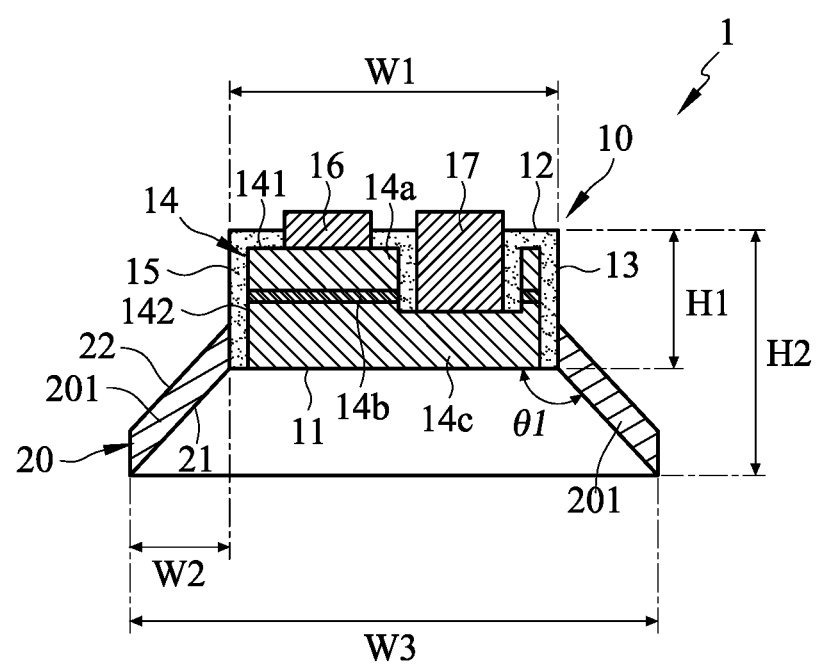
FIG. 1D is a partial cross-sectional view of FIG. 1A taken along A-A line.

In the present embodiment, as shown in FIG. 1A, a joint area S2 of the outer sidewall 13 corresponding to the buffer element 20 is less than the area S1 of each outer sidewall 13 of the micro light-emitting chip 10 (S2<S1). In particular, a ratio of the joint area S2 to the area S3 of the outer sidewall 13 is greater or equal to 0.01 and less than or equal to 0.7 (0.01≤S2/S1≤0.7). An area of the outermost end of the buffer element 20 away from the outer sidewall 13 is less than or equal to the joint area S2 (S3≤S2). As shown in FIG. 1C, the buffer element 20 has a second orthographic projection area S4 on the plane parallel to the first surface 11. The second orthographic projection area S4 is less than three times the first orthographic projection area S5 (S4<3*S5), but is not limited thereto. The larger second orthographic projection area S4 occupies too much space.

Figure 13A:
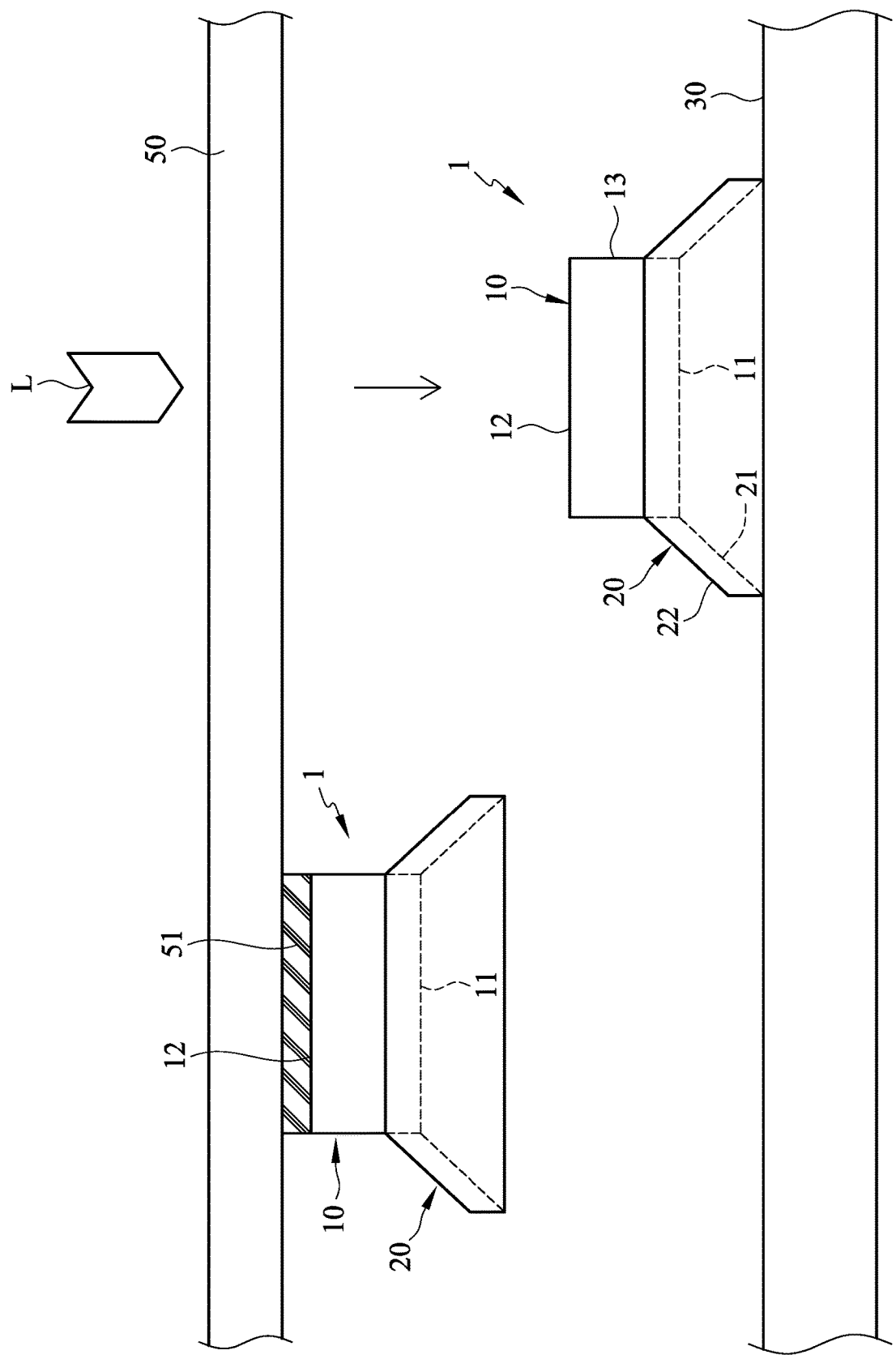
FIG. 13A is a schematic operational view of a micro light-emitting chip in one transferring procedure in accordance with the present invention.
Figure 13B:
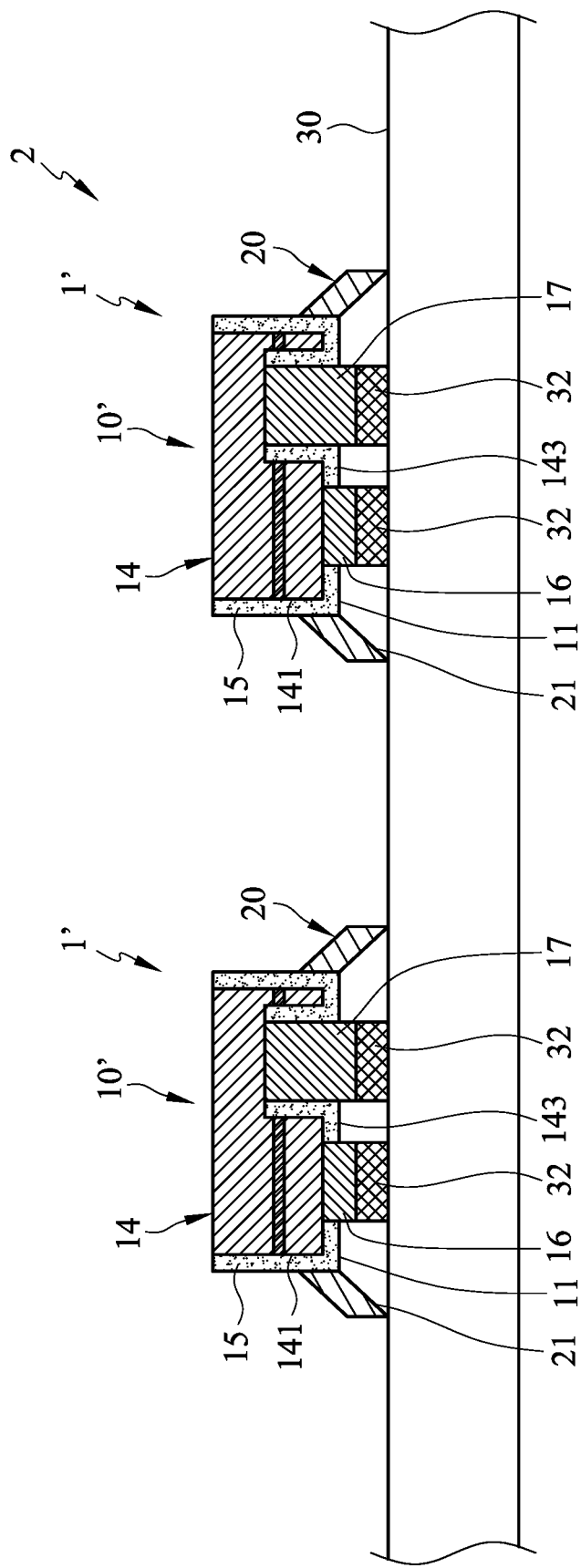
FIG. 13B is a cross-sectional view of a micro light-emitting structure in accordance with the present invention.

With reference to FIG. 13A, more micro light-emitting components 1 are provided. The second surface 12 of each micro light-emitting chip 10 is disposed on a release layer 51 on a temporary carrier 50. When a laser light L irradiates one of the micro light-emitting components 1, the micro light-emitting component 1 is dropped on a substrate 30. During dropping, the buffer element 20 provides the buffering function to decrease the dropping speed of the micro light-emitting chip 10. Furthermore, since the buffer element 20 of the present embodiment has the greater second orthographic projection area S4, the micro light-emitting chip 10 is not easily turned over when it is dropped on the substrate 30. The temporary carrier 50 may be a substrate without any circuit, such as a glass substrate, sapphire substrate or the like and has a well flatness. The temporary carrier 50 is used to temporarily carry at least one micro light-emitting component 1 in the transferring procedure.

Figure 2A:
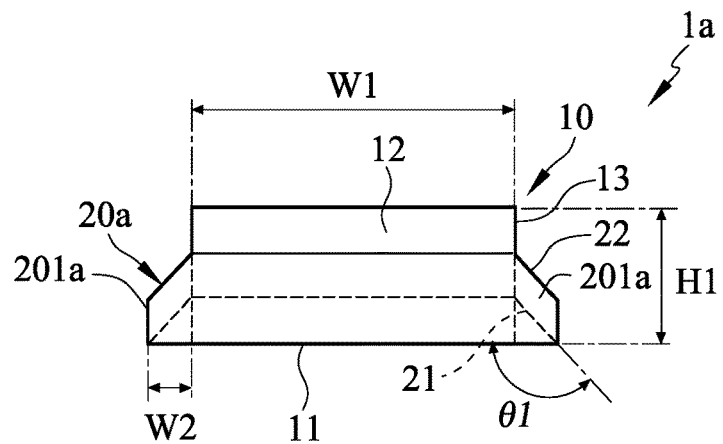
FIG. 2A is a side view of a second embodiment of a micro light-emitting component in accordance with the present invention.

FIG. 2A illustrates a side view of a second embodiment of a micro light-emitting component 1a of the present invention. The micro light-emitting component 1a of FIG. 2A is similar to that of FIG. 1D and also has a micro light-emitting chip 10 and a buffer element 20a. In the second embodiment, the buffer element 20a has a plurality sub-buffers 201a and one end of each sub-buffer 201a is disposed on a corresponding outer sidewall 13. In particular, the end of each sub-buffer 201a is disposed on a middle position of the corresponding outer sidewall 13. The other end of each sub-buffer 201a is flush with a first surface 11 of the micro light-emitting chip 10 and a lateral size of the buffer element 20a is reduced. An angle θ1 is defined between an inner surface 21 of the buffer element 20a and an extended plane of the first surface 11 is greater than 90 degrees and less than or equal to 180 degrees.

Figure 2B:
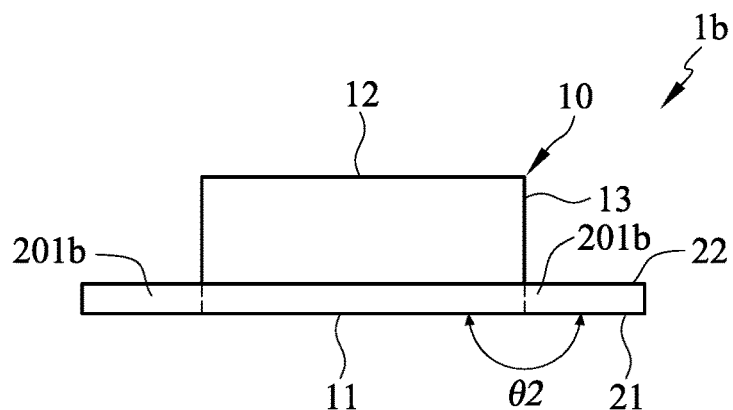
FIG. 2B is a side view of a third embodiment of a micro light-emitting component in accordance with the present invention.

FIG. 2B illustrates a side view of a third embodiment of a micro light-emitting component 1b of the present invention. The micro light-emitting component 1b of FIG. 2B is similar to that of FIG. 2A and also has a micro light-emitting chip 10 and a buffer element 20b. In the third embodiment, the buffer element 20b has a plurality sub-buffers 201b. One end of each sub-buffer 201b is disposed on a corresponding outer sidewall 13, and the other end thereof is away from the corresponding outer sidewall 13. An angle θ2 defined between an inner surface 21 of the buffer element 20b and a first surface 11 is equal to 180 degrees. In particular, the inner surface 21 of the buffer element 20b is flush with the first surface 11 but is not limited thereto.

Figure 2C:
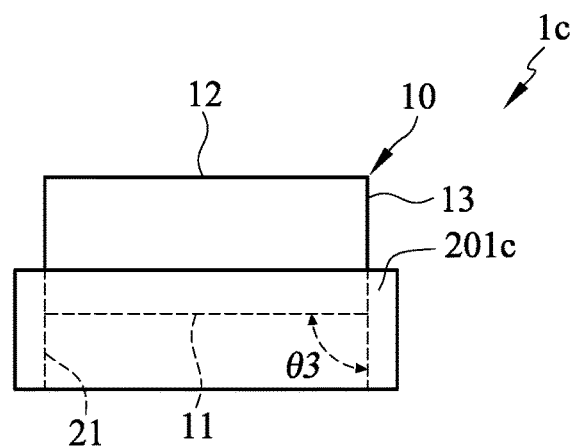
FIG. 2C is a side view of a fourth embodiment of a micro light-emitting component in accordance with the present invention.

FIG. 2C illustrates a side view of a fourth embodiment of a micro light-emitting component 1c of the present invention. The micro light-emitting component 1c of FIG. 2C is similar to that of FIG. 2A and also has a micro light-emitting chip 10 and a buffer element 20c. In the fourth embodiment, the buffer element 20c has a plurality sub-buffers 201c. One end of each sub-buffer 201c is disposed on a corresponding outer sidewall 13, and the other end thereof is away from the corresponding outer sidewall 13. In the fourth embodiment, an angle θ3 defined between an inner surface 21 of the buffer element 20c and a first surface 11 is equal to 90 degrees. The buffer element 20c protrudes from the first surface 11 of the micro light-emitting chip 10.

Figure 3A:
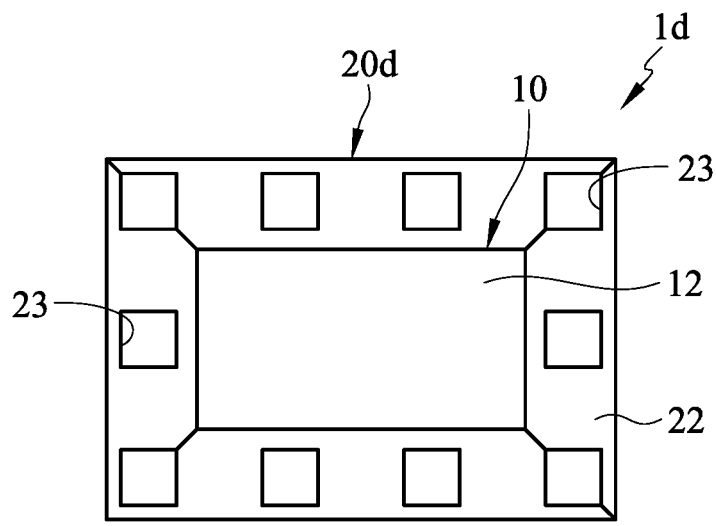
FIG. 3A is a side view of a fifth embodiment of a micro light-emitting component in accordance with the present invention.
Figure 3B:
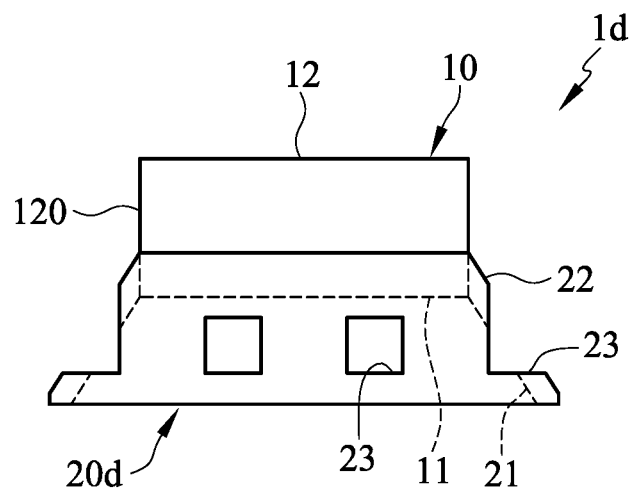
FIG. 3B is a side view of FIG. 3A.

FIGS. 3A and 3B respectively illustrate a top view and a side view of a fifth embodiment of a micro light-emitting component 1d of the present invention. The micro light-emitting component 1d of FIGS. 3A and 3B is similar to that of FIGS. 1A and 1C and also has a micro light-emitting chip 10 and a buffer element 20d. In the fifth embodiment, the buffer element 20d has a plurality of through holes 23 formed through an inner surface 23 and an outer surface 22. In comparison with the first embodiment of FIGS. 1A and 1C, the buffer element 20d of the fifth embodiment has a weaker structural strength so the buffer element 20d is easily removed by crashing way in the later procedure. An area ratio of a sum of the areas of the through hole 23 and an area of the inner surface 21 or the outer surface 22 of the buffer element 20d is between 0.1 and 0.5. If the area ratio is too small, a greater crashing force is required to remove the buffer element 20d. If the area ratio is too large, the buffering function of the buffer element 20d gets worse.

Figure 4A:
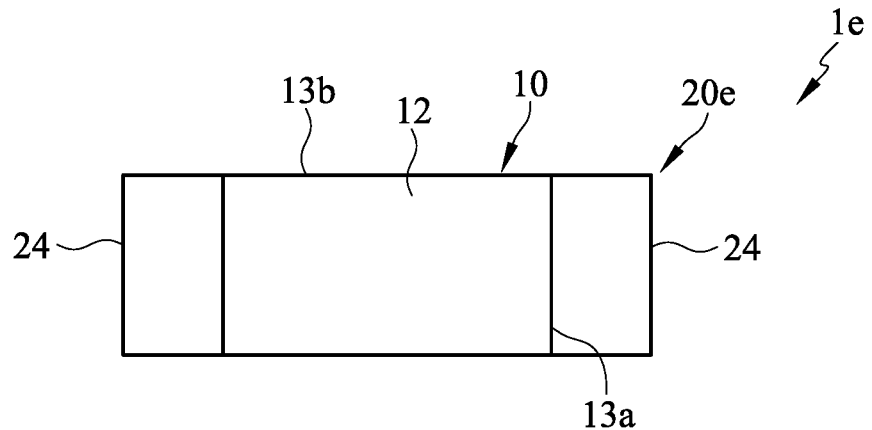
FIG. 4A is a side view of a sixth embodiment of a micro light-emitting component in accordance with the present invention.
Figure 4B:
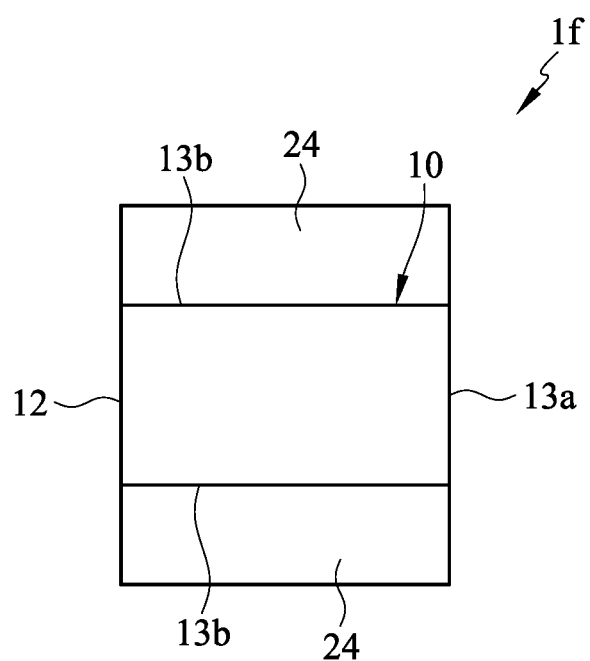
FIG. 4B is a side view of a seventh embodiment of a micro light-emitting component in accordance with the present invention.

FIG. 4A illustrates a top view of a sixth embodiment of a micro light-emitting component 1e of the present invention. The micro light-emitting component 1e of FIG. 4A is similar to that of FIG. 1A and also has a micro light-emitting chip 10 and a buffer element 20e. In the sixth embodiment, the buffer element 20e has two sub-buffers 24, and the two sub-buffer 24 are respectively disposed on two opposite short outer sidewalls 13a of the micro light-emitting chip 10. Alternatively, with reference to FIG. 4B, a seventh embodiment of a micro light-emitting component if is shown. Two sub-buffers 24 of a buffer element 20f are disposed on the two opposite long outer sidewalls 13b of a micro light-emitting chip 10. With further reference to FIGS. 1D and 2A to 2C, an angle is defined between an inner surface 21 of each sub-buffer 24 and a first surface 11 or an extended plane of the first surface 11. The angle of the sixth and seventh embodiments may be one of the angles of the first to fourth embodiments.

Figure 5A:
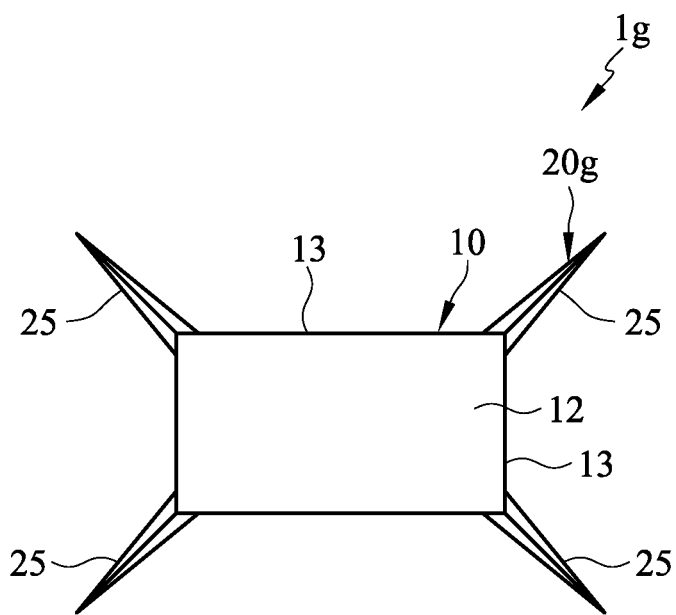
FIG. 5A is a top view of an eighth embodiment of a micro light-emitting component in accordance with the present invention.
Figure 5B:
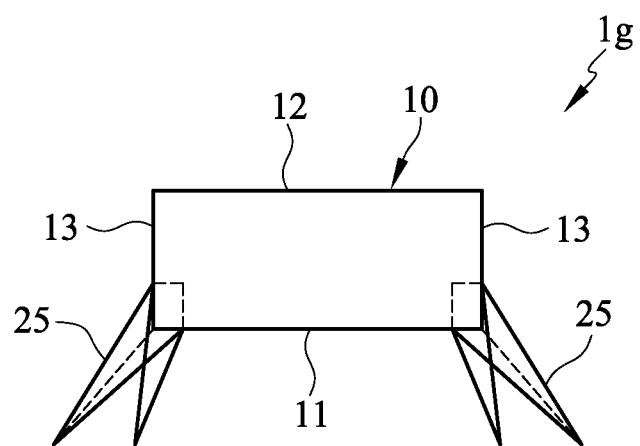
FIG. 5B is a side view of FIG. 5A.

FIGS. 5A and 5B respectively illustrate a top view and a side view of an eighth embodiment of a micro light-emitting component 1g of the present invention. The micro light-emitting component 1g of FIGS. 5A and 5B is similar to that of FIG. 1A and also has a micro light-emitting chip 10 and a buffer element 20g. In the eighth embodiment, the buffer element 20g has four sub-buffers 25. Each of the sub-buffers 25 is disposed on a corresponding corner between two adjacent outer sidewalls 13 of the micro light-emitting chip 10 and protrudes from a first surface of the micro light-emitting chip 10. In the eighth embodiment, a free end of each sub-buffer 25 is formed as a tip and the tip provides a supporting function and is also easily removed by crashing way, but not limited thereto.

Figure 6A:
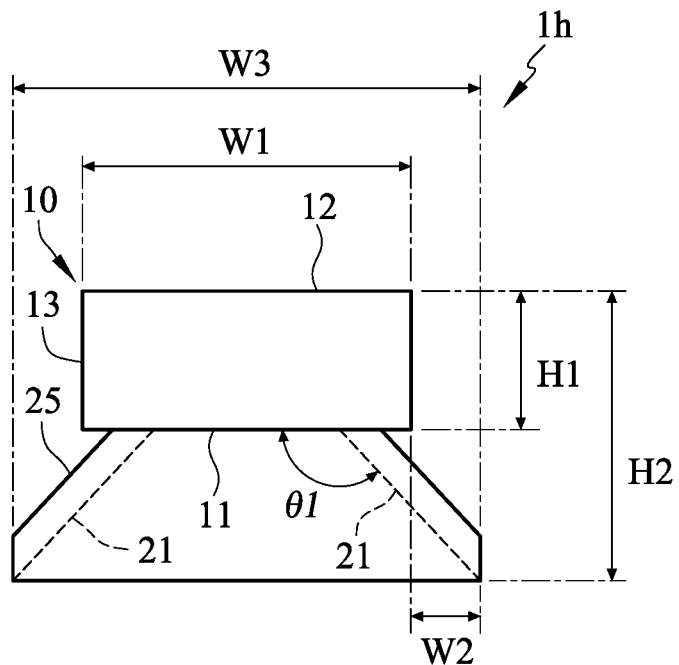
FIG. 6A is a side view of a ninth embodiment of a micro light-emitting component in accordance with the present invention.
Figure 6B:
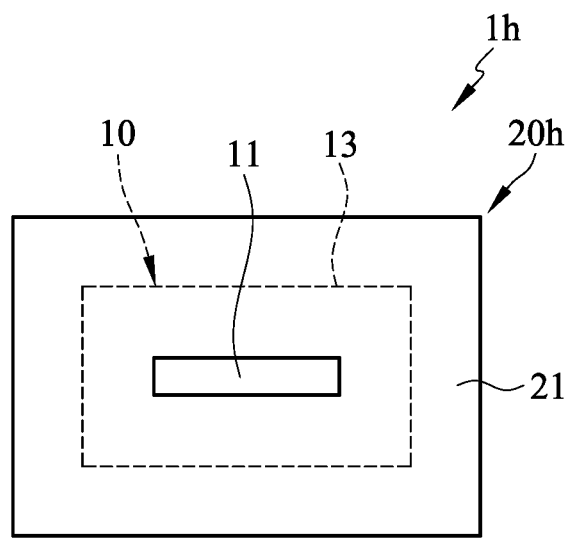
FIG. 6B is a top view of FIG. 6A.

FIGS. 6A and 6B respectively illustrate a side view and a bottom view of a ninth embodiment of a micro light-emitting component 1h of the present invention. The micro light-emitting component 1h of FIGS. 6A and 6B is similar to that of FIGS. 1A and 1D and also has a micro light-emitting chip 10 and a buffer element 20h. In the ninth embodiment, the buffer element 20h has a plurality of sub-buffers 201 disposed on a first surface 11 of the micro light-emitting chip 10. An outermost end of each sub-buffer 201 protrudes from the corresponding outer sidewall 13. In the ninth embodiment, an angle θ1 defined between an inner surface 21 of the buffer element 20h and the first surface 11 is greater than 90 degrees and less than 180 degrees (90°<θ1<180°). In the ninth embodiment, a shape of the buffer element 20h is the same as that of the buffer element 20 of the first embodiment, so a ratio of a first vertical distance H1 to a second vertical distances H2 and a ratio of a width W1 of the micro light-emitting chip 10 to a horizontal distance W2 can refer to the corresponding ratios of the first embodiment of FIG. 1D as described.

Figure 7A:
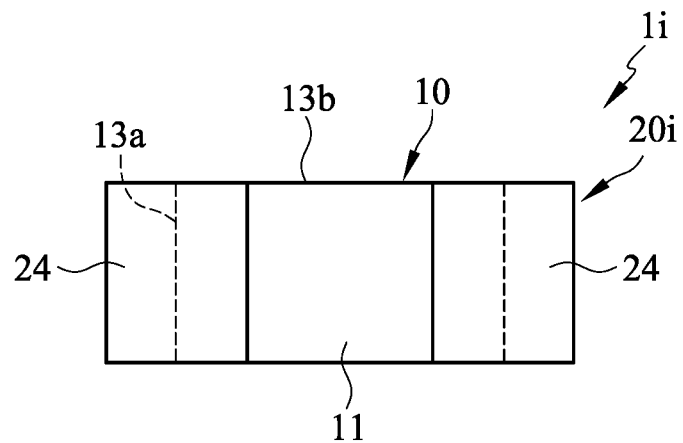
FIG. 7A is a bottom view of a tenth embodiment of a micro light-emitting component in accordance with the present invention.
Figure 7B:
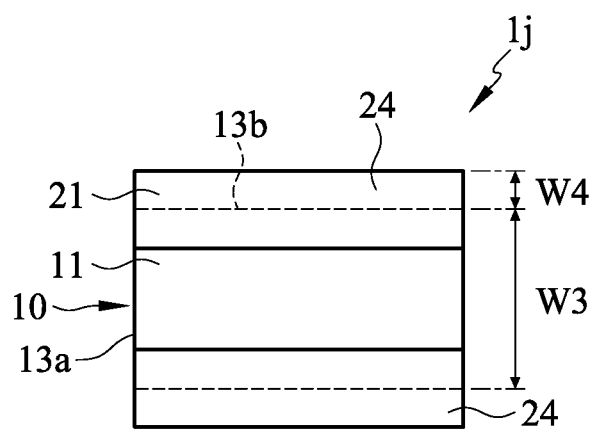
FIG. 7B is a bottom view of an eleventh embodiment of a micro light-emitting component in accordance with the present invention.

FIG. 7A illustrates a bottom view of a tenth embodiment of a micro light-emitting component 1i of the present invention. The micro light-emitting component 1i of FIG. 7A is similar to that of FIGS. 6A and 6B and also has a micro light-emitting chip 10 and a buffer element 20i. In the tenth embodiment, the buffer element 20i has two sub-buffers 24. The two sub-buffer 24 are disposed on a first surface 11 of the micro light-emitting chip 10 and respectively protrudes from two corresponding short outer sidewalls 13a. Alternatively, with reference to FIG. 7B, an eleventh embodiment of a micro light-emitting component 1j is shown and two sub-buffers 24 of a buffer element 20j. The two sub-buffer 24 are disposed on a first surface 11 of the micro light-emitting chip 10 and respectively protrudes from two corresponding long outer sidewalls 13b. With further reference to FIGS. 1D, 2A and 2B, an angle is defined between an inner surface 21 of each sub-buffer 24 and a first surface 11 or an extended plane of the first surface 11. The angle of the tenth and eleventh embodiments may be one of the angles of the first to third embodiments.

Figure 8:
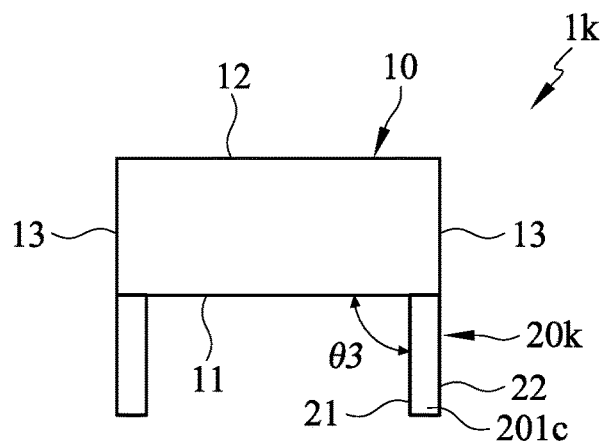
FIG. 8 is a side view of a twelfth embodiment of a micro light-emitting component in accordance with the present invention.
Figure 9A:
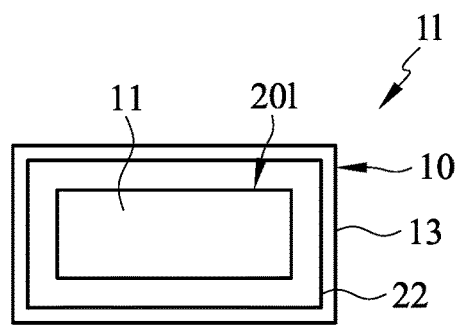
FIG. 9A is a bottom view of a thirteenth embodiment of a micro light-emitting component in accordance with the present invention.

FIG. 8 illustrates a side view of a twelfth embodiment of a micro light-emitting component 1k of the present invention. The micro light-emitting component 1k of FIG. 8 is similar to that of FIGS. 6A and 6B and also has a micro light-emitting chip 10 and a buffer element 20k. In the twelfth embodiment, the buffer element 20k has a plurality of sub-buffers 201c. One end of each sub-buffer 201c is disposed on a first surface 11 of the micro light-emitting chip 10 and is close to a corresponding outer sidewall 13. The other end of each sub-buffer 201c is away from the first surface 11. An angle θ3 defined between an inner surface 21 of the buffer element 20k and the first surface 11 is 90 degrees. In the twelfth embodiment, an outer surface 22 of the buffer element 20k is flush with the corresponding outer sidewall 13 to balance a weight of the micro light-emitting chip 10 and provides a good supporting function. Alternatively, FIG. 9A illustrates a bottom view of a thirteenth embodiment of a micro light-emitting component 1l of the present invention. An outer surface 21 of each sub-buffer 201 is in a first surface 11 so the outer surface 21 is not flush with the corresponding outer sidewall 13 of the micro light-emitting chip 10.

Figure 9B:
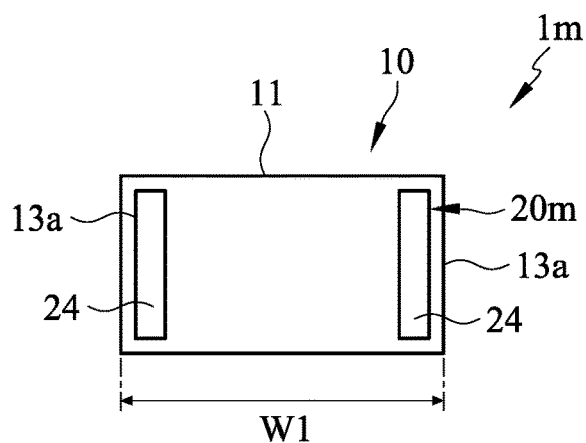
FIG. 9B is a bottom view of a fourteenth embodiment of a micro light-emitting component in accordance with the present invention.
Figure 9C:
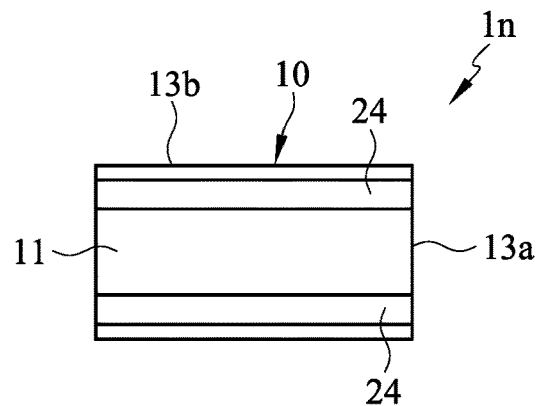
FIG. 9C is a bottom view of a fifteenth embodiment of a micro light-emitting component in accordance with the present invention.

FIG. 9B illustrates a bottom view of a fourteenth embodiment of a micro light-emitting component 1m of the present invention. The micro light-emitting component 1m of FIG. 9B is similar to that of FIG. 9A and also has a micro light-emitting chip 10 and a buffer element 20m. In the fourteenth embodiment, the buffer element 20m has two sub-buffers 24 and the two sub-buffer 24 are disposed on a first surface 11 and is close to two opposite short outer sidewalls 13a of the micro light-emitting chip 10. Alternatively, with reference to FIG. 9C, a fifteenth embodiment of a micro light-emitting component 1n is shown, and two sub-buffers 24 are disposed on a first surface 11 of the micro light-emitting chip 10 and is close to two opposite long outer sidewalls 13b.

Figure 9D:
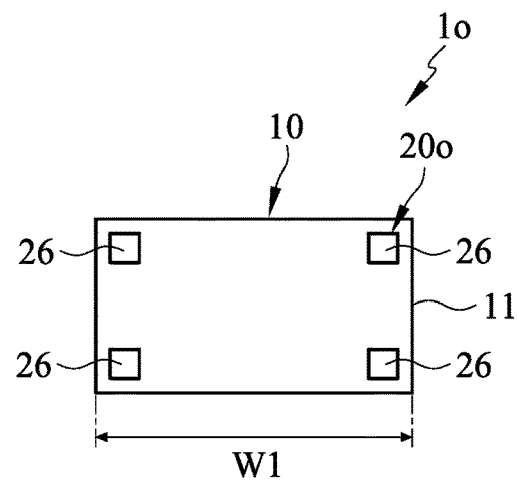
FIG. 9D is a bottom view of a sixteenth embodiment of a micro light-emitting component in accordance with the present invention.
Figure 10:
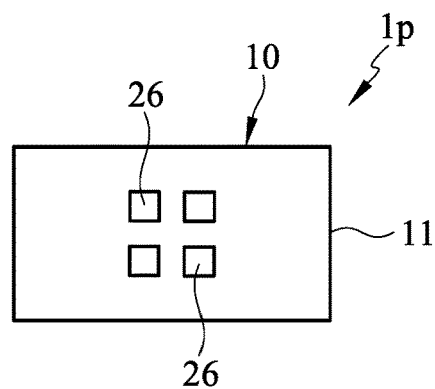
FIG. 10 is a bottom view of a seventeenth embodiment of a micro light-emitting component in accordance with the present invention.

FIG. 9D illustrates a bottom view of a sixteenth embodiment of a micro light-emitting component 1o of the present invention. The micro light-emitting component 1o of FIG. 9D is similar to that of FIG. 9A and also has a micro light-emitting chip 10 and a buffer element 20o. In the sixteenth embodiment, the buffer element 20o has at least two sub-buffers 26. The at least two sub-buffer 24 are symmetrically disposed on to a first surface 11. In particular, the buffer element 20o has four sub-buffers 26. The four sub-buffer 26 are disposed on the first surface 11 and are close to the corresponding corners. Alternatively, with reference to FIG. 10, a seventeenth embodiment of a micro light-emitting component 1p is shown and four sub-buffers 26 are disposed on a first surface 11 of the micro light-emitting chip 10 and are close to a central zone of the first surface 11. Therefore, when the micro light-emitting component 1p is dropped down, the sub-buffers 26 provides a better balance function.

Figure 11:
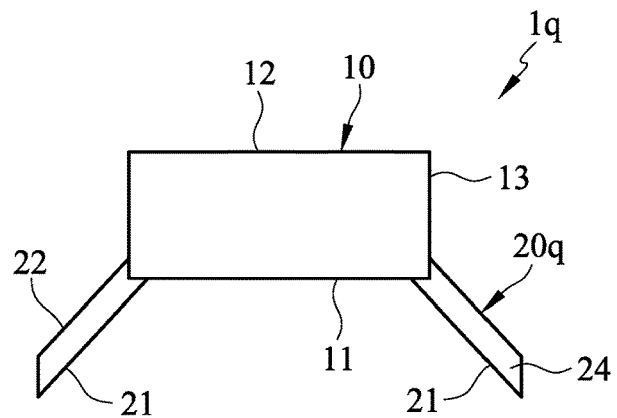
FIG. 11 is a bottom view of an eighteenth embodiment of a micro light-emitting component in accordance with the present invention.

FIG. 11 illustrates a bottom view of an eighteenth embodiment of a micro light-emitting component 1q of the present invention. The micro light-emitting component 1q of FIG. 4A is similar to that of FIG. 9A and also has a micro light-emitting chip 10 and a buffer element 20q. In the eighteenth embodiment, the buffer element 20q has at least two sub-buffers 24. In particular, each sub-buffer 24 is disposed on a corresponding outer sidewall 13 and further extended to a part of a first surface 11 adjacent to the outer sidewall 13. That is, each sub-buffer 24 is disposed on a joint between an adjacent outer sidewall 13 and a first surface 11, so a structural stability between the buffer element 20q and the micro light-emitting chip 10 is enhanced.

Figure 12A:
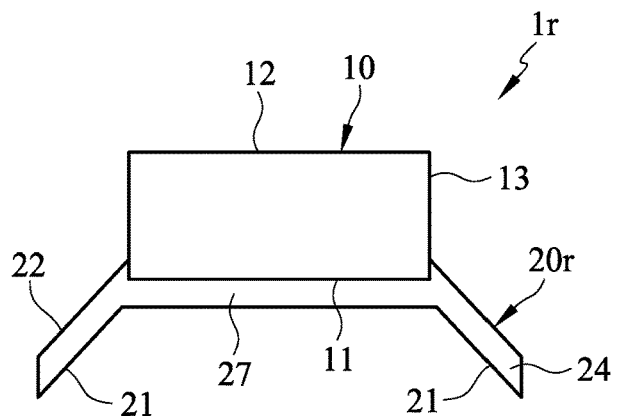
FIG. 12A is a bottom view of a nineteenth embodiment of a micro light-emitting component in accordance with the present invention.
Figure 12B:
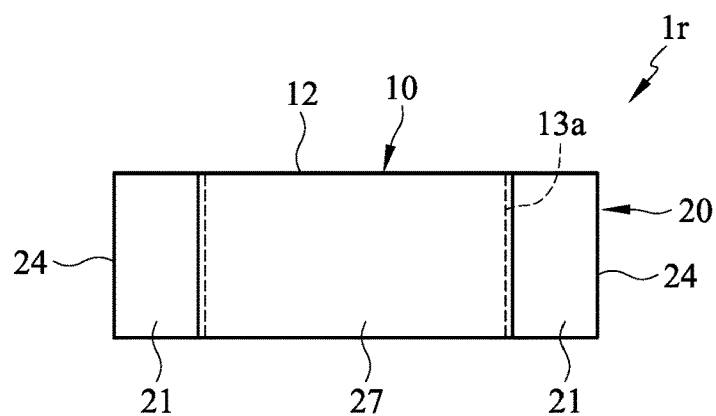
FIG. 12B is a bottom view of FIG. 12A.

FIGS. 12A and 12B illustrate a side view and a bottom view of a nineteenth embodiment of a micro light-emitting component 1r of the present invention. The micro light-emitting component 1r of FIGS. 12A and 12B is similar to that of FIG. 4A and also has a micro light-emitting chip 10 and a buffer element 20r. In the nineteenth embodiment, the buffer element 20r has at least two sub-buffers 24. In particular, the buffer element 20r further has a cover 27. The cover 27 covers the first surface 11 and is connected between two inner surfaces 21 of the two sub-buffers 24. In present embodiment, the cover 27 covers a whole of the first surface 11. In one embodiment, the cover 27 may be patterned to increase a light efficiency of the micro light-emitting chip 10 but is not limited thereto.

Different embodiments of the micro light-emitting components are described. A micro light-emitting structure and a display device respectively consisted of transferred micro light-emitting chips are further introduced as follows.

With reference to FIG. 13B, an embodiment of a micro light-emitting structure 2 of the present invention is shown. The micro light-emitting structure 2 has a substrate 30 and a plurality of micro light-emitting chips 1' disposed on the substrate 30. The micro light-emitting component 1' of a twentieth embodiment is similar to that of FIG. 1D. In the present embodiment, the insulation layer 15 is formed on the bottom surface 143 and the outsides 141 of the epitaxial layer 14. The two electrodes 16, 17 are formed on the bottom surface 143 and expose from the insulation layer 15. During the transferring procedure, the first surface 11 of the micro light-emitting chip 1' and the inner surface 21 of the buffer element 20 face to the substrate 30 and the two electrodes 16, 17 align with the pads 32 on the substrate 30. After the micro light-emitting chip 1' is dropped on the substrate 30, the electrodes 16, 17 are directly bonded to the corresponding pads 32 since the first surface 11 faces the substrate 30. During dropping, the buffer element 20 of FIG. 1D decreases a dropping speed of the micro light-emitting component 1'. When the micro light-emitting component 1' is dropped onto the substrate 30, the buffer member 20 provides a buffering function to prevent the micro light-emitting chip 10' from being damaged. As shown in FIG. 1C, since the second orthographic projection area S4 of the buffer element 20 is greater than the first orthographic projection area S5, the micro light-emitting component 1' does not easily turn over and a bonding accuracy is enhanced. In one embodiment, the substrate 30 may be a circuit substrate, such as a TFT substrate, PCB substrate or CMOS substrate, and a plurality of pads are formed thereon. As shown in FIG. 13B, during a dropped-transferring procedure, the first surface 11 of the micro light-emitting component 1' and the inner surface 21 of the buffer element 20 faces the substrate 30 and the two electrodes 16, 17 are aligned to the pads on the substrate 30. Therefore, a cavity is constituted among the first surface 11, the inner surface 21 and the substrate 30. When the electrodes 16, 17 are solder-bonding to the pads, the buffer element 20 also prevents the solder from overflowing outwardly. In another embodiment, the substrate may be a substrate without circuits, such as a glass substrate, sapphire substrate or the like, and has good flatness for carrying at least one micro light-emitting component during transferring procedure.

Therefore, the micro light-emitting components of the first to eleventh and eighteenth to twentieth embodiments decreases the dropping speed thereof and do not easily turned over during dropping. The micro light-emitting components of the first and the fourth to twentieth embodiments can provide collision buffering function. Thus, a suitable substrate may be selected according to the micro light-emitting component to be carried.

Figure 14:
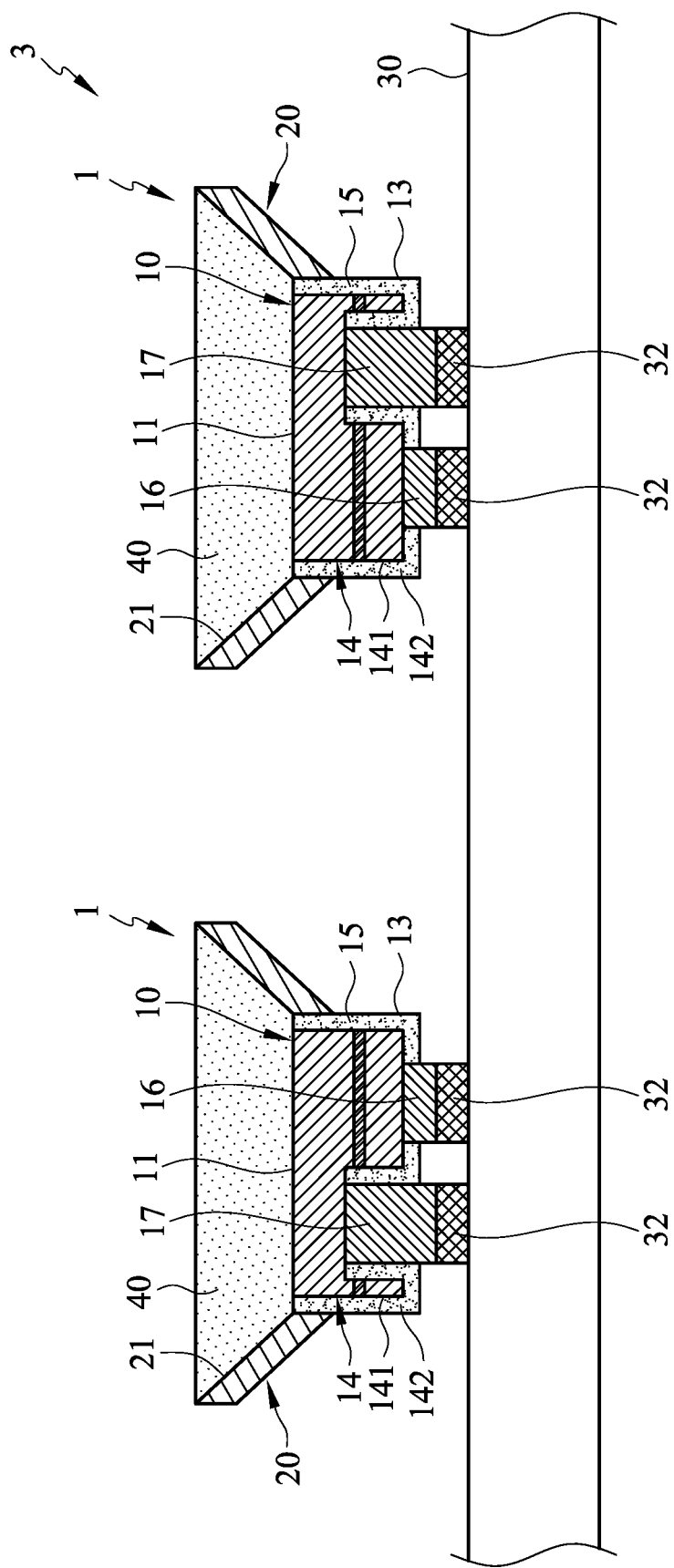
FIG. 14 is a cross-sectional view of a display device in accordance with the present invention.

With reference to FIG. 14, an embodiment of a display device 3 of the present invention has a substrate 30 and at least one micro light-emitting component 1. The substrate 30 has a plurality of pads 32. The two electrodes of the micro light-emitting component of FIG. 4A expose from the second surface 12 and are electrically connected to the corresponding pads on the substrate 30. In the present embodiment, the first surface 11 of the micro light-emitting component 1 corresponds to the top surface 141 of the epitaxial layer 14. The inner surface 21 of the buffer element 20 faces upwardly. A cavity is constituted among the first surface 11 and the inner surface 21. Therefore, a wavelength conversion material layer 40 is formed in the cavity may be a quantum dot or phosphor. The buffer element 20 may be used as a dam of the wavelength conversion material layer 40 of the display device 3 and is not removed. Particularly, in another embodiment (not shown), the micro light-emitting components are disposed on a release layer of a temporary carrier. The first surfaces 11 face the temporary carrier. As shown in FIG. 14, when the micro light-emitting component 1 is dropped on the circuit substrate 30, the cavity is formed between the buffer element 20 and the circuit substrate 30.

Based on the foregoing description, the micro light-emitting component of the present invention mainly has the buffer element disposed on the outer sidewalls or the first surface of the micro light-emitting chip and the angle is defined between the inner surface and the first surface or the extended surface of the first surface. The angle is greater than or equal to 90 degrees and less than or equal to 180 degrees. In the micro light-emitting structure as described, the first surfaces of the micro light-emitting components facing to the substrate and then dropping on the substrate has no collision damage by the protection of the buffer elements. In addition, when the electrodes on the corresponding second surfaces of the micro light-emitting components are electrically connected to the pads of the circuit substrate to constitute the display device, the inner surfaces of the buffer elements face upwardly to be used as the dam of the quantum dot and not to be removed.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A micro light-emitting component, comprising:
    a micro light-emitting chip having a first surface, a second surface opposite to the first surface and a plurality of outer sidewalls connected between the first surface and the second surface, wherein each outer sidewall of the micro light-emitting chip has a first area; and
    a buffer element disposed on the outer sidewalls or the first surface and having an inner surface and an outer surface;
    wherein an angle is defined between the inner surface and the first surface or an extended surface of the first surface, the angle is greater than or equal to 90 degrees and less than or equal to 180 degrees, and a joint between the buffer element and the first surface or one of the outer sidewalls of the micro light-emitting chip has a second area, wherein the second area is less than the first area.

2. The micro light-emitting component as claimed in claim 1, wherein
    the micro light-emitting chip has a first width; and the buffer element has a second width, which is a horizontal distance between one of the outer sidewalls and an outermost end of the buffer element away from the corresponding outer sidewall, wherein a ratio of the second width to the first width is between 0.2 and 0.8.

3. The micro light-emitting component as claimed in claim 1, wherein the micro light-emitting component has a maximum width and the micro light-emitting chip has a first width, wherein a ratio of the first width to the maximum width is between 0.5 and 0.9.

4. The micro light-emitting component as claimed in claim 1, wherein the buffer element protrudes the first surface and a ratio of a second vertical distance to a first vertical distance is between 1.2 and 2, wherein
the first vertical distance is defined between the second surface to the first surface and the second vertical distance is defined between the second surface and an outermost end of the buffer element protruding the first surface.

5. The micro light-emitting component as claimed in claim 1, wherein an outermost end of the buffer element away from the micro light-emitting chip has a third area, wherein the third area is less than or equal to the second area.

6. The micro light-emitting component as claimed in claim 1, wherein the micro light-emitting chip has a first orthographic projection area on a plane parallel to the first surface, and the buffer element has a second orthographic projection area on the plane, wherein the second orthographic projection is less than three times the first orthographic projection area.

7. The micro light-emitting component as claimed in claim 1, wherein the buffer element has a first end disposed on the corresponding outer sidewall and a second end opposite to the first end and flash with the first surface.

8. The micro light-emitting component as claimed in claim 1, wherein the inner surface of the buffer element is flash with the first surface.

9. The micro light-emitting component as claimed in claim 1, wherein the buffer element has a plurality of through holes formed through the outer surface and the inner surface.

10. The micro light-emitting component as claimed in claim 1, wherein the buffer element disposed on the outer sidewalls further extends to parts of the first surface adjacent to the outer sidewalls.

11. The micro light-emitting component as claimed in claim 10, wherein the buffer element further has a cover covering the first surface and connected to the inner surface.

12. The micro light-emitting component as claimed in claim 1, wherein the micro light-emitting chip has an epitaxial layer having a top surface and a plurality of outsides, and an insulation layer encapsulating the top surface and the outsides of the epitaxial layer.

13. The micro light-emitting component as claimed in claim 12, wherein a Young's modulus of the buffer element is less than or equal to that of the insulation layer.

14. The micro light-emitting component as claimed in claim 12, wherein an etching rate of the buffer element is greater than that of the insulation layer.

15. A micro light-emitting structure, comprising:
a substrate; and
a micro light-emitting component disposed on the substrate and having:
a micro light-emitting chip having a first surface, a second surface opposite to the first surface and a plurality of outer sidewalls connected between the first surface and the second surface; and
a buffer element disposed on the outer sidewalls or the first surface and having an inner surface and an outer surface;
wherein an angle is defined between the inner surface and the first surface or an extended surface of the first surface, the angle is greater than or equal to 90 degrees and less than 180 degrees, and a joint between the buffer element and the first surface or one of the outer sidewalls of the micro light-emitting chip has a second area, wherein the second area is less than the first area.

16. A display device, comprising:
a circuit substrate having two pads; and
a micro light-emitting component electrically connected to the circuit substrate and having:
a micro light-emitting chip having a first surface away from the circuit substrate, a second surface opposite to the first surface and having a plurality of electrodes electrically connected to the corresponding pads on the circuit substrate and a plurality of outer sidewalls connected between the first surface and the second surface; and
a buffer element disposed on the outer sidewalls or the first surface and having an inner surface and outer surface;
wherein an angle is defined between the inner surface and the first surface or an extended surface of the first surface, the angle is greater than or equal to 90 degrees and less than the 180 degrees, and a joint between the buffer element and the first surface or one of the outer sidewalls of the micro light-emitting chip has a second area, wherein the second area is less than the first area.

17. The display device as claimed in claim 16, wherein a cavity is consisted of the buffer element and the first surface of the micro light-emitting diode and a wavelength conversion material layer is formed in the cavity.

\* \* \* \* \*